US011157189B2

(12) United States Patent
Ippatapu

(10) Patent No.: US 11,157,189 B2
(45) Date of Patent: Oct. 26, 2021

(54) HYBRID DATA REDUCTION

(71) Applicant: Dell Products L.P., Round Rock, TX (US)

(72) Inventor: Venkata L. R. Ippatapu, Westborough, MA (US)

(73) Assignee: Dell Products L.P., Round Rock, TX (US)

( * ) Notice: Subject to any disclaimer, the term of this patent is extended or adjusted under 35 U.S.C. 154(b) by 20 days.

(21) Appl. No.: 16/507,362

(22) Filed: Jul. 10, 2019

(65) Prior Publication Data

US 2021/0011644 A1 Jan. 14, 2021

(51) Int. Cl.
G06F 3/06 (2006.01)
H03M 13/39 (2006.01)
G06K 9/62 (2006.01)

(52) U.S. Cl.
CPC .......... *G06F 3/0641* (2013.01); *G06F 3/0608* (2013.01); *G06F 3/0674* (2013.01); *G06K 9/6224* (2013.01); *H03M 13/3972* (2013.01)

(58) Field of Classification Search
None
See application file for complete search history.

(56) References Cited

U.S. PATENT DOCUMENTS

| | | | |
|---|---|---|---|
| 2009/0012982 A1* | 1/2009 | Merchia | H03M 7/30 |
| 2012/0131025 A1* | 5/2012 | Cheung | G06F 16/1752 |
| | | | 707/755 |
| 2014/0068505 A1* | 3/2014 | Hayes | G06F 3/04847 |
| | | | 715/800 |
| 2016/0203058 A1* | 7/2016 | Chavda | G06F 16/174 |
| | | | 707/686 |
| 2017/0017407 A1* | 1/2017 | Wei | G06F 3/0641 |
| 2020/0265044 A1* | 8/2020 | Yamane | G01C 21/3446 |

OTHER PUBLICATIONS

Xia, W. et al., A Comprehensive Study of the Past, Present, and Future of Data Deduplication, Proceedings of the IEEE, vol. 104, No. 9, Sep. 2016, pp. 1681-1710.

Welch, Terry A., A Technique for High-Performance Data Compression, IEEE, Jun. 1984.

* cited by examiner

*Primary Examiner* — Charles Rones
*Assistant Examiner* — Jonah C Krieger
(74) *Attorney, Agent, or Firm* — Jackson Walker L.L.P.

(57) ABSTRACT

An information handling system may include at least one processor and a memory coupled to the at least one processor. The information handling system may be configured to receive data comprising a plurality of data chunks; perform deduplication on the plurality of data chunks to produce a plurality of unique data chunks; determine a compression ratio for respective pairs of the unique data chunks; determine a desired compression order for the plurality of unique data chunks based on the compression ratios; combine the plurality of unique data chunks in the desired compression order; and perform data compression on the combined plurality of unique data chunks.

16 Claims, 3 Drawing Sheets

HYBRID DATA REDUCTION

TECHNICAL FIELD

The present disclosure relates in general to information handling systems, and more particularly to data reduction techniques such as deduplication and compression.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

The term "data reduction" refers generally to techniques for lessening the amount of space required for storage of such data. These techniques are particularly important in the field of data replication systems, for example in the cloud computing context.

For example, various techniques for data compression are known in the art. One such technique is described in Welch T.: "A Technique for High-Performance Data Compression," IEEE Computer 17(6) (July 1984), 8-19.

Another technique for data reduction is known as deduplication. One such technique is described in Xia W., Jiang H., Feng D., Douglis F., Shilane P., Hua Y., Fu M., Zhang Y., Zhou Y.: "A comprehensive study of the past, present, and future of data deduplication," Proceedings of the IEEE 104, 9 (September 2016), 1681-1710.

Data deduplication by comparing fixed-size data chunks typically does not offer an efficient solution that maximizes data reduction, because deduplication alone will not result in any data savings for two similar but non-identical data blocks (e.g., where only few bytes are altered in various byte positions). Data comparison operations between such similar (but not necessarily identical) data blocks are generally processed a byte or word at a time, which is expensive in terms of CPU time because every data block must be compared with other data blocks in a brute force manner, which results in increased latency of host I/O data and degrades the performance of storage systems. Optimizing the number of data comparisons and simultaneously meeting requirements for storage performance is a key factor in storage deduplication systems.

Therefore, there is a greater demand and necessity to implement application-level algorithms that effectively and efficiently use both data deduplication and data compression techniques for maximum data reduction, increasing the net data reduction by eliminating the deficiencies inherent in both deduplication and compression.

It should be noted that the discussion of a technique in the Background section of this disclosure does not constitute an admission of prior-art status. No such admissions are made herein, unless clearly and unambiguously identified as such.

SUMMARY

In accordance with the teachings of the present disclosure, the disadvantages and problems associated with data reduction may be reduced or eliminated.

In accordance with embodiments of the present disclosure, an information handling system may include at least one processor and a memory coupled to the at least one processor. The information handling system may be configured to receive data comprising a plurality of data chunks; perform deduplication on the plurality of data chunks to produce a plurality of unique data chunks; determine a compression ratio for respective pairs of the unique data chunks; determine a desired compression order for the plurality of unique data chunks based on the compression ratios; combine the plurality of unique data chunks in the desired compression order; and perform data compression on the combined plurality of unique data chunks.

In accordance with these and other embodiments of the present disclosure, a method may include receiving, at an information handling system, data comprising a plurality of data chunks; the information handling system performing deduplication on the plurality of data chunks to produce a plurality of unique data chunks; the information handling system determining a compression ratio for respective pairs of the unique data chunks; the information handling system determining a desired compression order for the plurality of unique data chunks based on the compression ratios; the information handling system combining the plurality of unique data chunks in the desired compression order; and the information handling system performing data compression on the combined plurality of unique data chunks.

In accordance with these and other embodiments of the present disclosure, an article of manufacture may include a non-transitory, computer-readable medium having computer-executable code thereon that is executable by a processor of an information handling system for: receiving data comprising a plurality of data chunks; performing deduplication on the plurality of data chunks to produce a plurality of unique data chunks; determining a compression ratio for respective pairs of the unique data chunks; determining a desired compression order for the plurality of unique data chunks based on the compression ratios; combining the plurality of unique data chunks in the desired compression order; and performing data compression on the combined plurality of unique data chunks.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
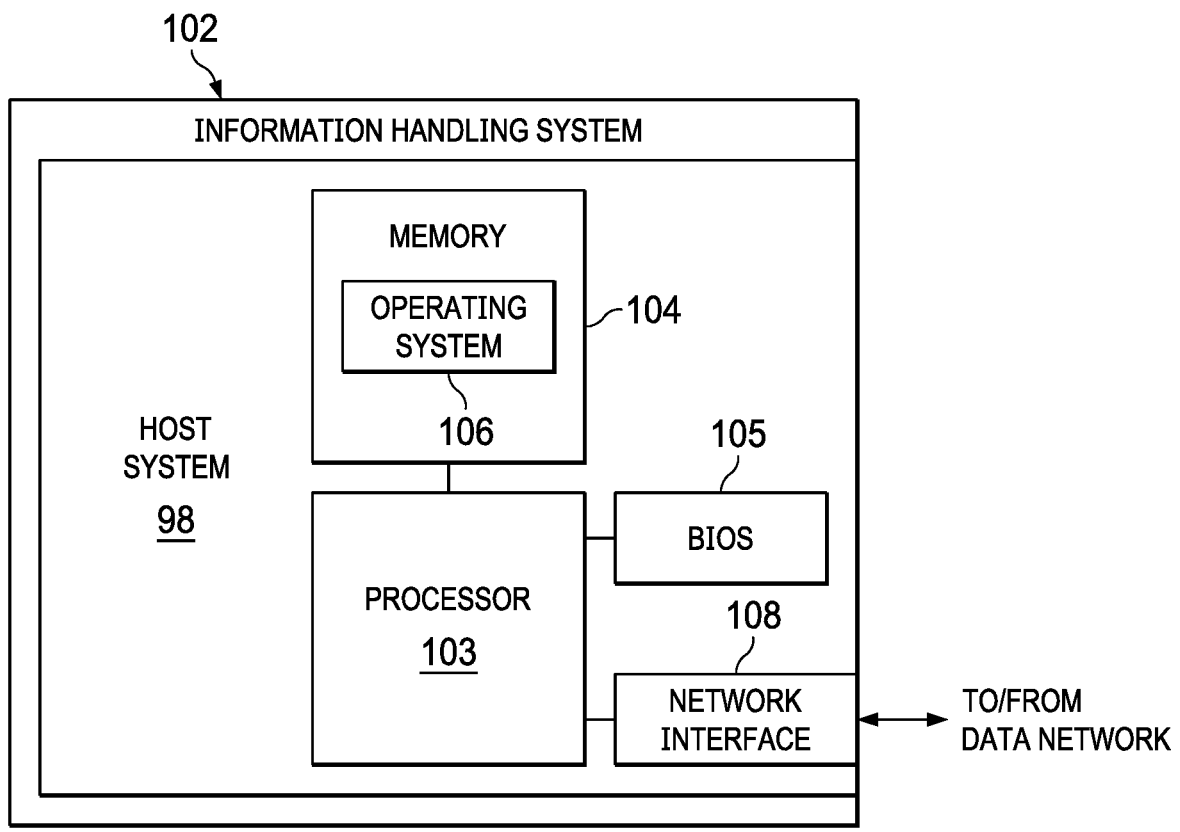
FIG. 1 illustrates a block diagram of an example information handling system, in accordance with embodiments of the present disclosure.

Preferred embodiments and their advantages are best understood by reference to FIGS. 1 through 4, wherein like numbers are used to indicate like and corresponding parts.

For the purposes of this disclosure, the term "information handling system" may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For purposes of this disclosure, when two or more elements are referred to as "coupled" to one another, such term indicates that such two or more elements are in electronic communication or mechanical communication, as applicable, whether connected directly or indirectly, with or without intervening elements.

When two or more elements are referred to as "coupleable" to one another, such term indicates that they are capable of being coupled together.

For the purposes of this disclosure, the term "computer-readable medium" (e.g., transitory or non-transitory computer-readable medium) may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; communications media such as wires, optical fibers, microwaves, radio waves, and other electromagnetic and/or optical carriers; and/or any combination of the foregoing.

For the purposes of this disclosure, the term "information handling resource" may broadly refer to any component system, device, or apparatus of an information handling system, including without limitation processors, service processors, basic input/output systems, buses, memories, I/O devices and/or interfaces, storage resources, network interfaces, motherboards, and/or any other components and/or elements of an information handling system.

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data (which may generally be referred to as "physical storage resources"). As shown in FIG. 1, information handling system 102 may comprise a processor 103, a memory 104 communicatively coupled to processor 103, a BIOS 105 (e.g., a UEFI BIOS) communicatively coupled to processor 103, and a network interface 108 communicatively coupled to processor 103.

In operation, processor 103, memory 104, BIOS 105, and network interface 108 may comprise at least a portion of a host system 98 of information handling system 102. In addition to the elements explicitly shown and described, information handling system 102 may include one or more other information handling resources such as a management controller (e.g., a baseboard management controller (BMC) and/or a chassis management controller (CMC).

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

As shown in FIG. 1, memory 104 may have stored thereon an operating system 106. Operating system 106 may comprise any program of executable instructions (or aggregation of programs of executable instructions) configured to manage and/or control the allocation and usage of hardware resources such as memory, processor time, disk space, and input and output devices, and provide an interface between such hardware resources and application programs hosted by operating system 106. In addition, operating system 106 may include all or a portion of a network stack for network communication via a network interface (e.g., network interface 108 for communication over a data network). Although operating system 106 is shown in FIG. 1 as stored in memory 104, in some embodiments operating system 106 may be stored in storage media accessible to processor 103, and active portions of operating system 106 may be transferred from such storage media to memory 104 for execution by processor 103.

Network interface 108 may comprise one or more suitable systems, apparatuses, or devices operable to serve as an interface between information handling system 102 and one or more other information handling systems via an in-band network. Network interface 108 may enable information handling system 102 to communicate using any suitable transmission protocol and/or standard. In these and other embodiments, network interface 108 may comprise a network interface card, or "NIC." In these and other embodiments, network interface 108 may be enabled as a local area network (LAN)-on-motherboard (LOM) card.

In accordance with embodiments of this disclosure, a highly efficient two-tier method may be used to maximize host data reduction by combining the technologies of first-tier data deduplication and second-tier data compression.

Embodiments of this disclosure may segregate and operate on the host I/O data in data chunks having a size equal to the sliding window size (W) of an underlying data compression technique or user-provided window size (W) value. (Within this disclosure, the terms "chunk" and "block" may be used interchangeably.) A first tier of a data reduction process may perform a data deduplication on these data chunks such that every redundant or identical W-byte data block may be replaced by a reference to the unique instance of the first occurrence position of that data block. After this first-tier processing has been performed, the unique instances of the data chunks may be passed to a second tier of the data reduction processing for data compression.

In accordance with some embodiments, the second tier data compression may use weighted graphs as a data structure for maximizing data reduction by selecting a desired ordering for the data chunks (e.g., an ordering that maximizes or increases a data compression ratio) and reordering the data chunks according to the desired order to maximize data compression of host data.

Generally speaking, a "compression ratio" is defined as the ratio of the size of uncompressed data to the size of the compressed version of that data. Within this disclosure, the compression ratio between two data blocks is defined as the ratio of the size of the uncompressed data to the size of the compressed data when those two data blocks are concatenated together and run through a data compression engine. For example, a data block A may be concatenated with a data block B and then compressed to determine the compression ratio for AB. One of ordinary skill in the art with the benefit of this disclosure will understand that such a compression ratio for AB may not be identical to the compression ratio for BA (e.g., if the two blocks were concatenated in the opposite order). For purposes of this disclosure, however, these two possible compression ratios are generally expected to have similar values. In practice, either ratio may be used, or the smaller of the two ratios may be used, etc.

In the weighted graph data structure mentioned above, the nodes of the graph may represent particular data chunks (e.g., unique data chunks that have already passed through a first tier of data deduplication). The edge weights of the graph may represent the compression ratios of the two nodes that they connect. In particular, the weights may be defined as the inverse (reciprocal) of the compression ratio between the two data chunks connected by an edge. For example, if the compression ratio of AB is 5:1, then the edge connecting A and B may have an edge weight of 1:5 (i.e., 0.2). Thus as a heuristic for determining an optimal (or sufficiently good) ordering of data chunks, embodiments of this disclosure may use techniques from graph theory to select edges that correspond to high compression ratios. These edges may then be combined into an ordering of data chunks that has a good overall compression ratio. (Without wishing to be limited by theory, it is believed that combining edges having good individual compression ratios will typically result in an ordering having a good overall compression ratio.)

Figure 2A:
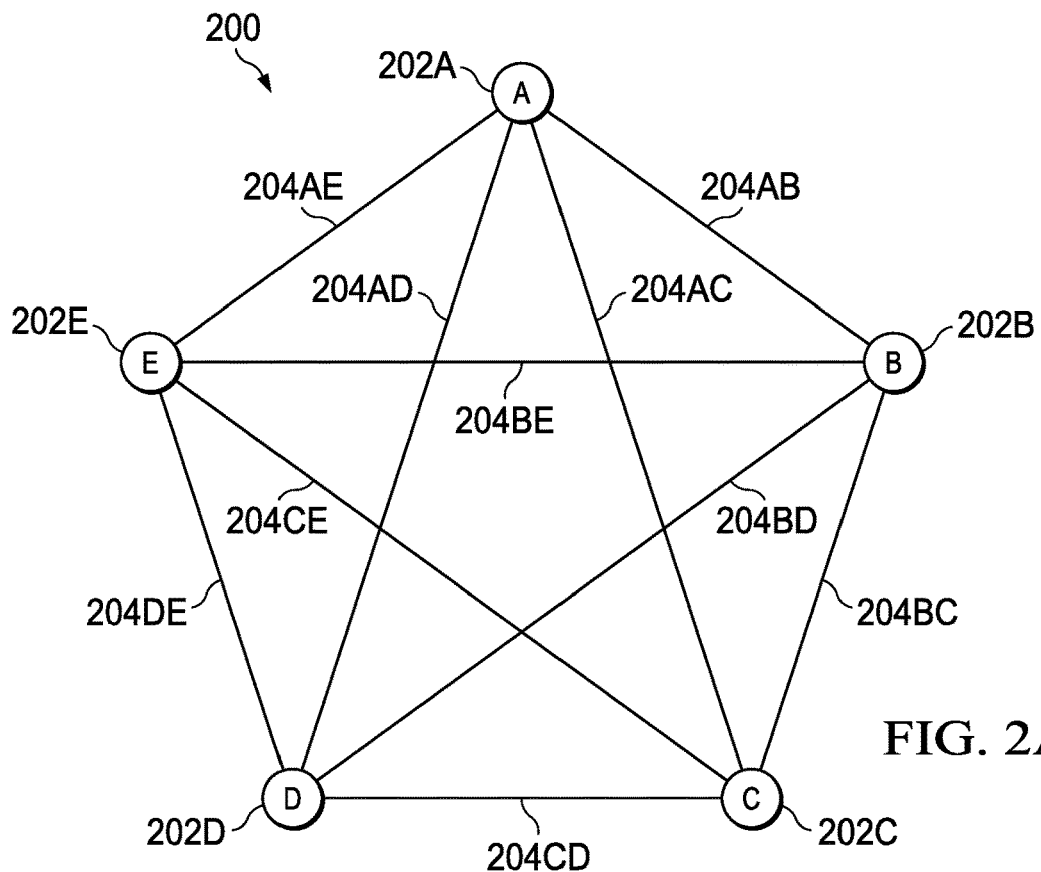
FIG. 2A illustrates a block diagram of a weighted graph of an example set of data chunks, in accordance with embodiments of the present disclosure.

Turning now to FIG. 2A, an example weighted graph 200 is shown in accordance with some embodiments of this disclosure. In this example, five data chunks A through E are depicted as graph nodes 202A, 202B, 202C, 202D, and 202E. Edges 204 are drawn between each pair of such nodes (e.g., edge 204AB connects nodes 202A and 202B, etc.). As one of ordinary skill in the art with the benefit of this disclosure will recognize, the number of data blocks may be larger or smaller in any particular situation.

As mentioned above, the weight of an edge in graph 200 may depend on the compression ratio of the pair of data chunks represented by the nodes that edge connects. In this embodiment, edges are given weights equal to the reciprocal of the compression ratio. In other embodiments, however, different relationships between compression ratio and edge weight may be used. In general, it may be advantageous to determine a monotonic correspondence between compression ratio and edge weight, for example such that larger compression ratios correspond to smaller weights. The use of the reciprocal compression ratio in this embodiment is one example of such a correspondence. In other embodiments, (e.g., with suitable changes made to the details of the method), a monotonic correspondence may be used such that larger compression ratios correspond to larger weights instead of smaller weights.

As shown in FIG. 2A, unique data blocks after data deduplication are inserted into the graph with their respective data chunk position as a node and the reciprocal of the compression ratio with every other data chunk as an edge. For every node, edges may be created with all other nodes having the reciprocal of the compression ratio between the source node and destination node. Thus for n data chunks, the graph generated in this way may be (a weighted version of) the complete graph on n nodes, Kn.

In particular, the ordered pair that constitutes an edge may be considered as the source and destination node throughout this disclosure. Once all of the nodes are added, techniques described herein may be used to find a subset of edges that gives an optimal (or at least high) compression ratio.

Figure 2B:
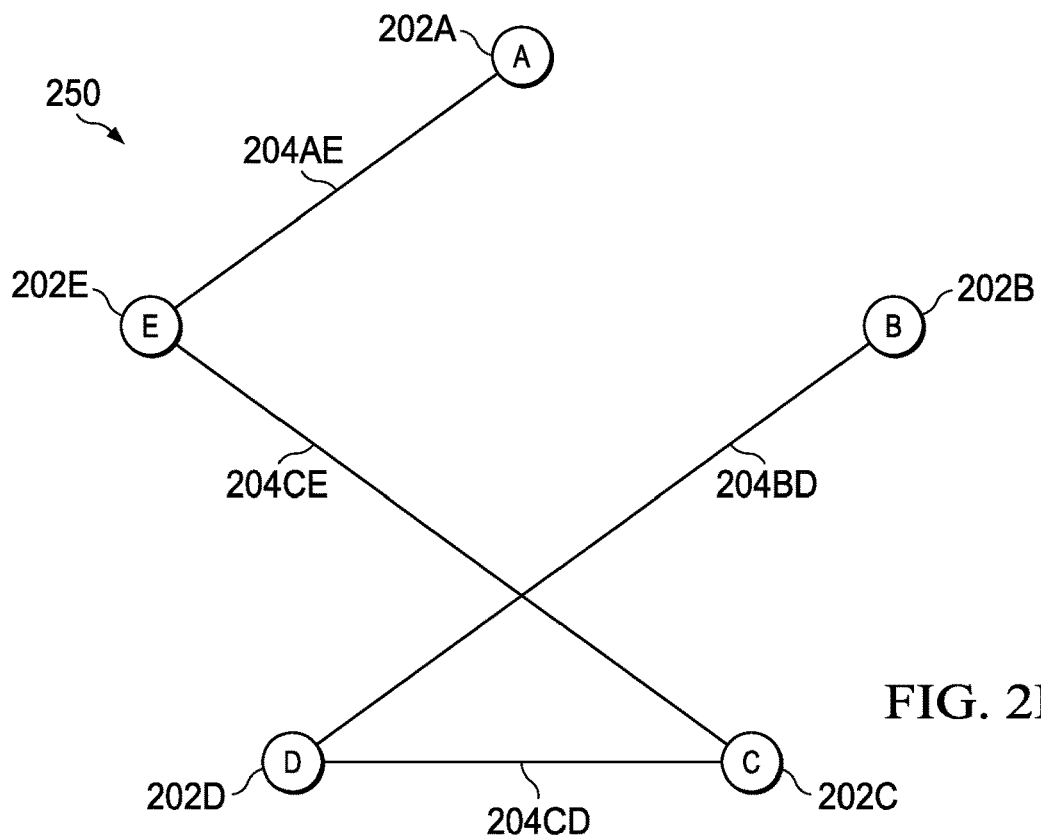
FIG. 2B illustrates a subset of the graph of FIG. 2A.

For example, a Hamiltonian path through graph 200 is a graph path that visits each node exactly once. The edges of such a path may be used to define the ordering of the data chunks. As one example, FIG. 2B shows graph 250, which corresponds to the Hamiltonian path BDCEA for graph 200. This path would correspond to an ordering of the data chunks in that same order (or in the reverse order, AECDB). Embodiments of this disclosure are concerned with finding a particular ordering that has desired properties such as a low total edge weight (corresponding to a high overall compression ratio).

To determine a Hamiltonian path that has such desired properties, a minimum-length Hamiltonian path may be calculated. Such a path may primarily use edges having small edge weights, which correspond to large compression ratios. Thus such a path may generate a data chunk ordering having a large overall compression ratio.

Determination of a minimum-length Hamiltonian path may be computationally difficult in some instances, however, and so other heuristics may be used to determine a suitable subset of edges corresponding to a desired data chunk ordering. For example, a greedy algorithm may be used to generate a Hamiltonian path having a total length that is "sufficiently small" even if it is not absolutely optimal.

As another example, the combination of edges that constitutes a minimum spanning tree of graph 200 may be a more computationally tractable problem than determining the minimum-length Hamiltonian path, and it may generate an ordering with an acceptably large overall compression ratio. For example, Kruskal's Minimum Spanning Tree Algorithm may be used.

As one of ordinary skill in the art with the benefit of this disclosure will understand, such a minimum spanning tree may sometimes include branches, and so it may not always uniquely determine the desired ordering of data chunks. In such cases, branches may be selected randomly, or greedily, or in any suitable manner to determine a spanning tree that does not contain branches and has a "sufficiently small" overall edge weight. In other embodiments, the minimum spanning tree may be calculated first for computational efficiency, and if it contains branches, another technique altogether (e.g., searching for a shortest Hamiltonian path) may be employed.

In general, various techniques may be used to determine a path through graph 200 that has a sufficiently small overall edge weight, even if that path is not the absolute optimum.

One benefit of the use of weighted graph data structures is their flexibility to access different data chunks in relationships with other data chunks in a way that makes it easier to implement algorithms to check whether the nodes are connected to finding the shortest paths. This may allow for a faster, more effective solution and offer better data reduction than existing data deduplication techniques using fixed-size blocks data for comparison or data compression techniques alone. Further, embodiments may include no significant additional latency because of the light-weight graph traversal operations on the reordered unique chunks. As one of ordinary skill in the art with the benefit of this disclosure will understand, any of the techniques disclosed may significantly improve the overall data reduction performance of the system.

Figure 3:
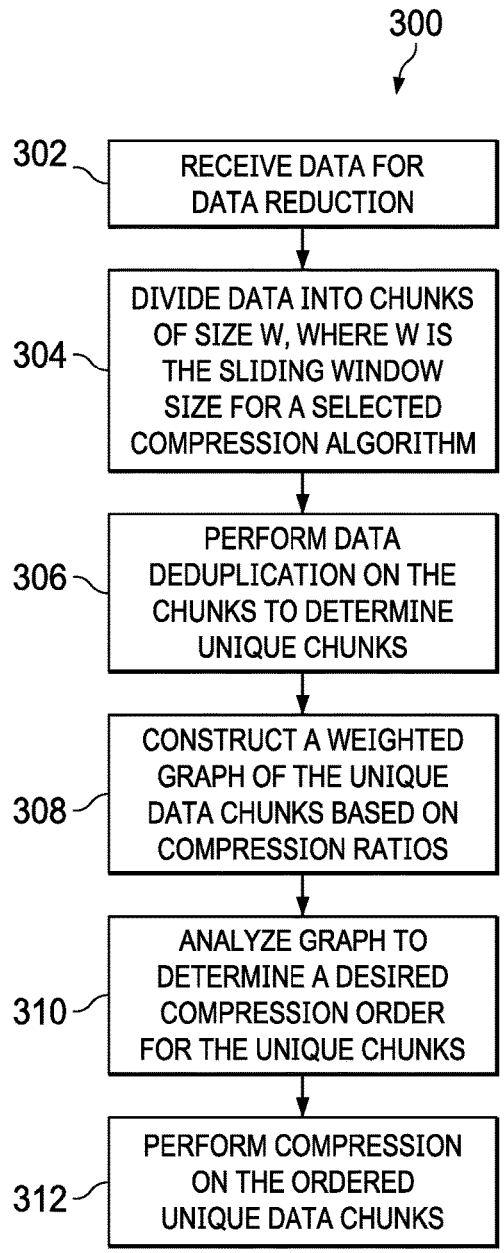
FIG. 3 illustrates an example flow diagram of a method for data reduction, in accordance with embodiments of the present disclosure.

FIG. 3 illustrates a flow chart of an example method 300 for data reduction in accordance with embodiments of the present disclosure. At step 302, an information handling system may receive the data which is to be reduced.

At step 304, the received data is divided into chunks. In some embodiments, the chunk size W may be selected to be equal to the sliding window size of the compression algorithm which will be used (discussed below at step 312) to compress the data.

For example, if the received data has a length of DataSize, the number of data blocks may be calculated as:

Number of $W$-byte data blocks $(N)$=DataSize/$W$

In other embodiments, the received data may already be divided into suitable chunks when it is received.

At step 306, data deduplication may be performed on the data chunks. Any of various deduplication techniques may be employed in this step, as will be understood by one of ordinary skill in the art with the benefit of this disclosure. In general, every redundant W-byte data block may be replaced with a reference to the unique first occurrence of that data block. The data block info header (discussed below) for that block may be updated with information to set the appropriate block info opcode to 1 to indicate that the redundant block has been deduplicated. The data block info header for every redundant block may be prepared in the same fashion.

The result of step 306 is a set of unique data chunks. Each redundant chunk has been replaced by a reference to one of the unique chunks, and these references need not be considered for the portion of the method dealing with weighted graph operations.

At step 308, a weighted graph is constructed based on the unique data chunks. In particular, the edge weights may be a function (e.g., a monotonic function such as a reciprocal) of the corresponding compression ratios between each respective pair of nodes.

At step 310, the graph may be analyzed to determine a subset of edges having a desired property. For example, in embodiments in which large compression ratios correspond to small edge weights, the desired property may be a small total edge weight. This may be accomplished by determining a shortest Hamiltonian path, a minimum spanning tree, etc. (In embodiments in which large compression ratios correspond to large edge weights, the desired property may be a large total edge weight, and a longest Hamiltonian path or the like may be determined.)

Once the desired subset of edges has been determined, the corresponding compression order for the unique chunks is also determined thereby.

At step 312, the information handling system may perform compression on the reordered unique data chunks. Any of various compression techniques may be employed in this step, as will be understood by one of ordinary skill in the art with the benefit of this disclosure. In particular, a compression technique that makes use of a sliding window size may be used to determine the chunk size W at step 304.

Once the data has been compressed, it may be stored in backend storage drives, or it may be sent (e.g., via Ethernet or Fiber Channel) to remote storage systems for data replication. Further, the data block information header and the compression data header information (discussed below) are updated accordingly to all the second tier data blocks, and the order of the data chunks used for data compression is maintained by the 'order' field of the compression data header. If the data is replicated across storage systems, the final compressed data processed by the second tier along with data block information and compression data headers may be transferred across storage systems.

According to some embodiments, a data block info header may be used for each data chunk to keep track of the various information that may be used when returning the data to its original form. For example, such a header may employ a data structure as follows:

```
Struct
{
    UINT32 reference_to_unique_data_block; // Index of
    // the data chunk in the host data
    UINT8 opcode;
} T_DATA_BLOCK_INFO
``` where

*T*_DATA_BLOCK_INFO=malloc(Number of data blocks*size of(*T*_DATA_BLOCK_INFO))

and where the opcodes may be defined such that a value of 1 corresponds to a deduplication operation and a value of 2 corresponds to a compression operation.

Accordingly, if there are (for example) 4 data chunks of size W, then there will be 4 headers for every data chunk that represents them:

T_DATA_BLOCK_INFO[4]=T_DATA BLOCK_INFO[0]+T_DATA BLOCK_INFO[1]+T_DATA BLOCK_INFO[2]+T_DATA BLOCK_INFO[3].

Additionally, a compression data header may be used to hold information for the operations performed by the second tier (the data compression engine). This header may maintain the correct order of data chunks that are compressed and the final data length after data compression header as well as the length of the data before and after compression. This header may be used for data restoration operations.

```
Struct
{
    UINT32 order; // Combined indexes of the data
    // chunk in the host data
    UINT32 data_len_after_compression;
    UINT32 data_len_before_compression;
    UINT16 num_of_data_chunks;
    UINT64 original_data_size_before_dedup_compress;
} T_Compression_data_header;
```

For example, if the value in the order field is 145, this may correspond to the first, fourth, and fifth blocks being processed in this order to achieve greater data reduction using data compression.

One of ordinary skill in the art with the benefit of this disclosure will understand that the preferred initialization point for the method depicted in FIG. 3 and the order of the steps comprising that method may depend on the implementation chosen. In these and other embodiments, this method may be implemented as hardware, firmware, software, applications, functions, libraries, or other instructions. Further, although FIG. 3 discloses a particular number of steps to be taken with respect to the disclosed method, the method may be executed with greater or fewer steps than those depicted. The method may be implemented using any of the various components disclosed herein (such as the components of FIG. 1), and/or any other system operable to implement the method.

Figure 4:
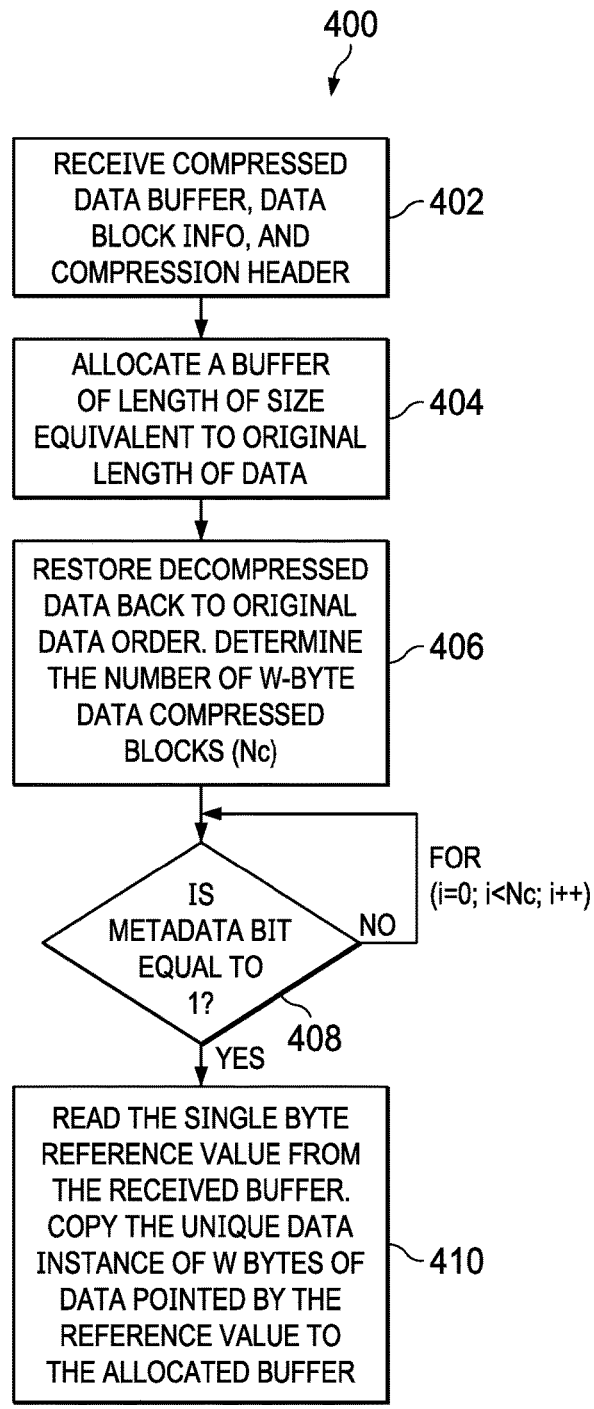
FIG. 4 illustrates an example flow diagram of a method for restoration of original data from deduplicated and compressed data, in accordance with embodiments of the present disclosure.

FIG. 4 illustrates a flow chart of an example method 400 for the use of a restoration unit for restoring the compressed and deduplicated data back to the original data, in accordance with embodiments of the present disclosure. In some embodiments, the inputs to the data restoration unit include the compressed data itself, the data block info headers, and the compression headers.

At step 402, an information handling system may receive a buffer containing the compressed data, as well as the data block info headers and the compression headers.

At step 404, a buffer may be allocated having a length equal to or greater than the size of the original data length.

A step 406, the decompressed data may be restored back to the original data order, and the number of W-byte data blocks (referred to as Nc) may be determined. This number may be determined based on information in the compression header. In particular, Nc=num_of_data_chunks from the compression header.

W=original_data_size_before_dedup_compress/num_data_chunks from compression header.

Further, the compressed data blocks that were compressed by the tier 2 data compression engine may be restored to their original order. This may be accomplished by first performing a decompression operation on the compressed data. Then the order of the data chunks may be obtained from the Data Compression Header's 'order' field (e.g., a value of 1436 would correspond to an order of first, fourth, third, sixth). Next, the number N of W-byte decompressed data blocks in the decompressed data may be computed as the length of the decompressed data divided by W.

Next, a number N of blocks may be traversed and copied to the allocated buffer at respective data location offsets. For example, the decompressed data for data block 3 may be copied at a location equal to (starting address of allocated buffer)+(3*W).

Further, as shown at steps 408 and 410, the deduplicated data blocks may also be restored to their original order. To accomplish this, the restoration unit may traverse N (number of data blocks) times and restore every deduplicated data back to its original data when the opcode (e.g., the metadata bit) for the current data block is 1 (indicating a deduplicated block).

The method may then read the single byte reference value from the data block info header and copy the data that is pointed by the reference value (e.g., reference_to_unique_data_block) to the buffer allocated. For example, as above, the data location to copy may be calculated as the (starting address of allocated buffer)+(3*array index of data block). After this step is completed, the original data is now restored and ready for use by the user.

One of ordinary skill in the art with the benefit of this disclosure will understand that the preferred initialization point for the method depicted in FIG. 4 and the order of the steps comprising that method may depend on the implementation chosen. In these and other embodiments, this method may be implemented as hardware, firmware, software, applications, functions, libraries, or other instructions. Further, although FIG. 4 discloses a particular number of steps to be taken with respect to the disclosed method, the method may be executed with greater or fewer steps than those depicted. The method may be implemented using any of the various components disclosed herein (such as the components of FIG. 1), and/or any other system operable to implement the method.

Embodiments of this disclosure may provide various advantages over existing solutions. For example, some embodiments may provide a faster and more effective solution, offering maximum data reduction by combining deduplication and compression technologies to maximize data reduction and simultaneously alleviate the deficiencies of technologies individually.

In some embodiments, the disclosed techniques may be light weight and determine the most desirable order of the data chunks to be compressed to achieve greater data reduction compared to current approaches.

In some embodiments, the disclosed techniques may be easily extended to choose different levels with data block sizes other than sliding window W-size byte data blocks.

In some embodiments, the disclosed techniques may have several applications and can be implemented for data replication systems to replicate data to remote storage systems.

In some embodiments, the disclosed techniques may be a highly cost-effective solution, opening the gateway for future development in combining data deduplication and compression technologies at the application level without a need to buy any additional expensive hardware.

Various possible advantages have been discussed herein. In any particular embodiment, however, some, all, or even none of such advantages may be applicable.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Further, reciting in the appended claims that a structure is "configured to" or "operable to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke § 112(f) during prosecution, Applicant will recite claim elements using the "means for [performing a function]" construct.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An information handling system comprising:
   at least one processor; and
   a memory coupled to the at least one processor;
   wherein the information handling system is configured to:
   receive data comprising a plurality of data chunks;
   perform deduplication on the plurality of data chunks to produce a plurality of unique data chunks;
   determine a compression ratio for respective pairs of the unique data chunks;
   determine a weighted graph based on the unique data chunks, wherein the weighted graph includes nodes consisting of the unique data chunks and further includes weighted edges between respective pairs of unique data chunks that are based on the compression ratio for that pair of unique data chunks, and wherein weights of the weighted edges are determined based on a monotonic function such that larger compression ratios correspond to smaller weights;
   determine a desired compression order for the plurality of unique data chunks based on the weighted graph;
   combine the plurality of unique data chunks in the desired compression order; and
   perform data compression on the combined plurality of unique data chunks.

2. The information handling system of claim 1, wherein the compression ratio is determined for every pair of unique data chunks.

3. The information handling system of claim 1, wherein the compression ratio for the respective pairs of the unique data chunks is determined by concatenating each pair of unique data chunks and performing a test compression of the concatenated pair.

4. The information handling system of claim 1, wherein the weights are determined such that each weight is a reciprocal of the corresponding compression ratio.

5. The information handling system of claim 4, further configured to:
   determine a minimum spanning tree for the weighted graph; and
   determine the desired compression order based on the minimum spanning tree.

6. The information handling system of claim 4, further configured to:
   determine a shortest Hamiltonian path for the weighted graph; and
   determine the desired compression order based on the shortest Hamiltonian path.

7. A method comprising:
   receiving, at an information handling system, data comprising a plurality of data chunks;
   the information handling system performing deduplication on the plurality of data chunks to produce a plurality of unique data chunks;
   the information handling system determining a compression ratio for respective pairs of the unique data chunks;
   the information handling system determining a weighted graph based on the unique data chunks, wherein the weighted graph includes nodes consisting of the unique data chunks and further includes weighted edges between respective pairs of unique data chunks that are based on the compression ratio for that pair of unique data chunks, and wherein weights of the weighted edges are determined based on a monotonic function such that larger compression ratios correspond to smaller weights;
   the information handling system determining a desired compression order for the plurality of unique data chunks based on the weighted graph;
   the information handling system combining the plurality of unique data chunks in the desired compression order; and
   the information handling system performing data compression on the combined plurality of unique data chunks.

8. The method of claim 7, wherein the data compression has a particular compression algorithm associated therewith, and the method further comprises dividing the data into the plurality of data chunks based on a sliding window size of the particular compression algorithm.

9. The method of claim 8, further comprising receiving a user selection of the sliding window size.

10. The method of claim 7, further comprising:
    the information handling system determining the desired compression order based on an approximation of a shortest or longest Hamiltonian path of the weighted graph.

11. An article of manufacture comprising a non-transitory, computer-readable medium having computer-executable code thereon that is executable by a processor of an information handling system for:
    receiving data comprising a plurality of data chunks;
    performing deduplication on the plurality of data chunks to produce a plurality of unique data chunks;

determining a compression ratio for respective pairs of the unique data chunks;

determine a weighted graph based on the unique data chunks, wherein the weighted graph includes nodes consisting of the unique data chunks and further includes weighted edges between respective pairs of unique data chunks that are based on the compression ratio for that pair of unique data chunks, and wherein weights of the weighted edges are determined based on a monotonic function such that larger compression ratios correspond to smaller weights;

determining a desired compression order for the plurality of unique data chunks based on the weighted graph;

combining the plurality of unique data chunks in the desired compression order; and performing data compression on the combined plurality of unique data chunks.

12. The article of claim 11, wherein the compression ratio is determined for every pair of unique data chunks.

13. The article of claim 11, wherein the compression ratio for the respective pairs of the unique data chunks is determined by concatenating each pair of unique data chunks and performing a test compression of the concatenated pair.

14. The article of claim 11, wherein the weights are determined such that each weight is a reciprocal of the corresponding compression ratio.

15. The article of claim 14, wherein the computer-executable code is further for:

determining a minimum spanning tree for the weighted graph; and determining the desired compression order based on the minimum spanning tree.

16. The article of claim 14, wherein the computer-executable code is further for:

determining a shortest Hamiltonian path for the weighted graph; and determining the desired compression order based on the shortest Hamiltonian path.

* * * * *